(12) United States Patent
Cordes et al.

(10) Patent No.: US 7,694,869 B2
(45) Date of Patent: Apr. 13, 2010

(54) UNIVERSAL MOLD FOR INJECTION MOLDING OF SOLDER

(75) Inventors: Steven A. Cordes, Yorktown Heights, NY (US); Peter A. Gruber, Mohegan Lake, NY (US); John U. Knickerbocker, Monroe, NY (US); James L. Speidell, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 249 days.

(21) Appl. No.: 11/409,242

(22) Filed: Apr. 21, 2006

(65) Prior Publication Data

US 2007/0246516 A1  Oct. 25, 2007

(51) Int. Cl.
*B23K 31/00* (2006.01)
*H05K 3/34* (2006.01)

(52) U.S. Cl. .............. 228/180.22; 228/225; 228/253; 228/254; 438/107; 438/108

(58) Field of Classification Search .. 228/180.1–180.22
See application file for complete search history.

(56) References Cited

U.S. PATENT DOCUMENTS

| | | | |
|---|---|---|---|
| 5,244,143 A * | 9/1993 | Ference et al. | 228/180.21 |
| 5,254,362 A | 10/1993 | Shaffer et al. | |
| 5,593,080 A | 1/1997 | Teshima et al. | |
| 5,718,367 A * | 2/1998 | Covell et al. | 228/254 |
| 6,153,505 A * | 11/2000 | Bolde et al. | 438/613 |
| 6,332,569 B1 | 12/2001 | Cordes et al. | |
| 6,390,439 B1 * | 5/2002 | Cordes et al. | 249/119 |
| 6,641,868 B2 | 11/2003 | Abe et al. | |
| 6,725,769 B1 | 4/2004 | Williams | |
| 7,032,513 B2 | 4/2006 | Onishi et al. | |
| 7,322,511 B2 | 1/2008 | Farrar et al. | |
| 2001/0035450 A1 | 11/2001 | Mannhart et al. | |
| 2003/0170935 A1 | 9/2003 | Rutiser | |
| 2004/0108368 A1 | 6/2004 | Onishi et al. | |
| 2004/0238595 A1 | 12/2004 | Nogiwa et al. | |
| 2005/0051604 A1 | 3/2005 | Claver et al. | |

OTHER PUBLICATIONS

Advanced Packaging Magazine, Nov. 2005.

(Continued)

*Primary Examiner*—Jessica L. Ward
*Assistant Examiner*—Devang Patel
(74) *Attorney, Agent, or Firm*—Jose Gutman; Fleit Gibbons Gutman Bongini & Bianco P.L.

(57) ABSTRACT

A system, method, and device for applying conductive bonding material to a substrate are disclosed. The method includes providing conductive bonding material in a plurality of cavities of a mold. A total number of cavities in the plurality of cavities being greater than a total number of at least one conductive pad of a circuit supporting substrate corresponding to the mold. The conductive bonding material in the mold is heated to a reflow temperature of the conductive bonding material. At least one wettable surface is placed in substantial contact with the heated conductive bonding material in at least one cavity. The mold and the corresponding circuit supporting substrate are brought in close proximity to each other such that the heated conductive bonding material in at least one cavity comes in contact with at least one conductive pad of the corresponding circuit supporting substrate.

5 Claims, 10 Drawing Sheets

OTHER PUBLICATIONS

Gruber, et al., "Low-cost wafer bumping," IBM J. Research and Development, vol. 49, No. 4.5, Jul./Sep. 2005, pp. 621-639.

Technology Roadshow 2005 for Advanced Packaging, MEMS and Nanotechnologies.

* cited by examiner

UNIVERSAL MOLD FOR INJECTION MOLDING OF SOLDER

CROSS REFERENCE TO RELATED APPLICATION

The present patent application is related to co-pending and commonly owned U.S. patent application Ser. No. 11/409,232, entitled "Rotational Fill Techniques For Injection Molding Of Solder"; U.S. patent application Ser. No. 11/409,233, entitled "FILL HEAD FOR INJECTION MOLDING OF SOLDER"; and U.S. patent application Ser. No. 11/409,244, entitled "CONDUCTIVE BONDING MATERIAL FILL TECHNIQUES", all filed on even date with the present patent application, the entire teachings of which being hereby incorporated by reference.

FIELD OF THE INVENTION

The present invention generally relates to the field of injection molding of solder, and more particularly relates to molds used during the injection molding of solder process.

BACKGROUND OF THE INVENTION

In modern semiconductor devices, the ever increasing device density and decreasing device dimensions demand more stringent requirements in the packaging or interconnecting techniques of such devices. Conventionally, a flip-chip attachment method has been used in the packaging of IC chips. In the flip-chip attachment method, instead of attaching an IC die to a lead frame in a package, an array of solder balls is formed on the surface of the die. The formation of the solder balls is normally carried out by an evaporation method of lead and tin through a mask for producing the desired solder balls. However, the evaporation method has many drawbacks such as inefficient use of material, degraded yields when the pitch falls below 225 μm, non-stable evaporation masks for 300 mm wafers.

Another method for depositing solder balls is solder paste screening. However, with the recent trend in the miniaturization of device dimensions and the reduction in bump-to-bump spacing (or pitch), the solder paste screening technique becomes impractical. For instance, one of the problems in applying solder paste screening technique to modern IC devices is the paste composition itself. Pastes are generally composed of a flux and solder alloy particles. The consistency and uniformity of the solder paste composition become more difficult to control with a decreasing solder bump volume.

A possible solution for this problem is the utilization of solder pastes that contain extremely small and uniform solder particles. However, this can only be done at a high cost penalty. Another problem in using the solder paste screening technique in modern high density devices is the reduced pitch between bumps. Since there is a large reduction in volume from a screened paste to the resulting solder bump, the screen holes must be significantly larger in diameter than the final bumps. The stringent dimensional control of the bumps makes the solder paste screening technique impractical for applications in high density devices.

A more recently developed injection molded solder ("IMS") technique attempted to solve these problems by dispensing molten solder instead of solder paste. However, problems have been observed when the technique is implemented to wafer-sized substrates. U.S. Pat. No. 5,244,143, which is commonly assigned to International Business Machines Corporation, discloses the injection molded solder technique and is hereby incorporated by reference in its entirety. One of the advantages of the IMS technique is that there is very little volume change between the molten solder and the resulting solder bump. The IMS technique utilizes a solder head that fills boro-silicate glass molds that are wide enough to cover most single chip modules.

The IMS method for solder bonding is then carried out by applying a molten solder to a substrate in a transfer process. When smaller substrates, i.e., chip scale or single chip modules are encountered, the transfer step is readily accomplished since the solder-filled mold and substrate are relatively small in area and thus can be easily aligned and joined in a number of configurations. For instance, the process of split-optic alignment is frequently used in joining chips to substrates. The same process may also be used to join a chip-scale IMS mold to a substrate (chip) which will be bumped. One problem with current IMS systems is that they are restricted to linear deposition of solder into rectangular molds. That is, the mold and the solder head are moved linearly with respect to each other such that the cavities move perpendicular to a slit in the solder head thereby filling the cavities as they pass. The molds are limited to a rectangular configuration.

The mold materials used for IMS to date have included borofloat glass, silicon wafers, kapton, and polyimide on glass, carbon, and recently molybdenum. Each of these has advantages and disadvantages. The most commonly used material to date has been borofloat glass, because of its durability, ease of alignment, excellent temperature coefficient of expansion, and ability to easily make the proper form-factor (rectangular and thick enough to provide rigidity).

One problem with several of the mold materials, including borofloat, kapton, polyimide on glass, is that an existing infrastructure for building the molds does not exist. Unlike glass masks used in plating of solder, or metal masks used in evaporation of solder, both of which are readily available internationally, mold fabrication does not exist in mass production. While infrastructure does exist for some mold fabrication, such as molybdenum, this suffers from other disadvantages.

A problem common to the solder ball forming techniques discussed above and other techniques not discussed such as molten solder screening is with the mold used for transferring solder balls to substrates. Current molds comprise a pattern of cavities with a one to one correspondence to pads on a substrate, that is, cavities on a mold only exist at locations corresponding to a location on a substrate with a pad. In other words, current molds can only be used for a particular substrate design. Every new or change in design requires a new build of a mask or mold. This is true for existing technologies of plating and evaporation, as well as with IMS. In most cases, it is also preferable to produce multiple copies of masks or molds for throughput or redundancy. The costs for these new masks and molds will vary significantly, but are costly. This also drives delivery time, which can gate the delivery of final parts. This is especially costly in the event of a redesign, which can take several weeks onto the delivery schedule.

Therefore a need exists to overcome the problems with the prior art as discussed above.

SUMMARY OF THE INVENTION

Briefly, in accordance with the present invention, disclosed are a system, device, and method for applying conducting bonding material to a circuit supporting substrate. The method includes providing conductive bonding material in a plurality of cavities of a mold. A total number of cavities in the plurality of cavities being greater than a total number of at least one conductive pad of a circuit supporting substrate corresponding to the mold. The conductive bonding material in the mold is heated to a reflow temperature of the conductive bonding material. The mold and the corresponding circuit supporting substrate are brought in close proximity to each other such that the heated conductive bonding material in at least one cavity of the plurality of cavities comes in contact with at least one conductive pad of the at least one conductive pad of the corresponding circuit supporting substrate.

In another embodiment of the present invention an integrated circuit chip is disclosed. The integrated circuit chip comprises a circuit support substrate. At least one electronic circuit disposed on the circuit support substrate is also included. At least one conductive pad is disposed on the circuit support substrate. Each conductive pad in the plurality of conductive pads is arranged at a pitch corresponding to at least a minimum pitch value. The pitch of each conductive pad is substantially equal to a pitch of a corresponding cavity on a mold. The pitch of the plurality of conductive pads is substantially equal to a pitch of corresponding cavities on a mold. At least one non-conductive-pad-position situated on the circuit support substrate is included. The at least one non conductive-pad-position including at least one indication of contact with conductive bonding material in a cavity on the mold. The at least one non conductive-pad-position is arranged at a pitch that is substantially equal to a pitch of a corresponding cavity on the mold.

In yet another embodiment of the present invention a system for applying conducting bonding material to a circuit supporting substrate is disclosed. The system comprises a mold for selectively providing conductive bonding material to a circuit supporting substrate having at least one conductive pad. The mold including a plurality of cavities, wherein a total number of cavities in the plurality of cavities is greater than a total number of at least one conductive pad of the circuit supporting substrate.

Also included in the system is at least one conductive bonding material placement device for providing conductive bonding material into the plurality of cavities of the at least one mold. The mold being placed in close proximity to the circuit supporting substrate for transferring the conductive bonding material to the circuit supporting substrate.

In yet a further embodiment of the present invention, a mold for applying conducting bonding material to a substrate is disclosed. The mold comprises a plurality of cavities, each cavity in the plurality of cavities arranged at a pitch corresponding to at least a minimum pitch value. A total number of cavities in the plurality of cavities is greater than a total number of conductive pads of a corresponding circuit supporting substrate.

An advantage of the foregoing embodiments of the present invention is that molds can be used interchangeably across different chips of the same design ground rules, e.g. solder pitch pad, regardless of pad density, die size, or form factor. Another advantage of the present invention is that a mold exists for any required pad pitch, e.g. 3 mils or mili-inches on 6 mils or mili-inches centers, 4 mils or mili-inches pads on 8 mils or mili-inches centers, and the like, additional molds do not need to be made. In other words, the universal molds can be used with substrates comprising various pad layouts.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention.

DETAILED DESCRIPTION

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

The present invention, according to an embodiment, overcomes problems with the prior art by providing molds that can be used interchangeably across different chips of the same design ground rules, e.g. solder pitch pad, regardless of pad density, die size, or form factor. Another advantage of the present invention is that a mold exists for any required pad pitch, e.g. 3 mils or mili-inches pads on 6 mils or mili-inches centers, 4 mils or mili-inches pads on 8 mils or mili-inches centers, and the like, additional molds do not need to be made. In other words, the molds can be used with substrates comprising various pad layouts.

Another advantage of the present invention is that pitch is already maintained across given chips, which are defined lithographically by the design sizes on existing photomasks. The present invention can be implemented with existing wafer builds and existing mask sets by performing a simple stepping dimension change so that the same even pitch of pads across kerf channels or dicing channels is achieved.

Prior Art Molds

Figure 1:
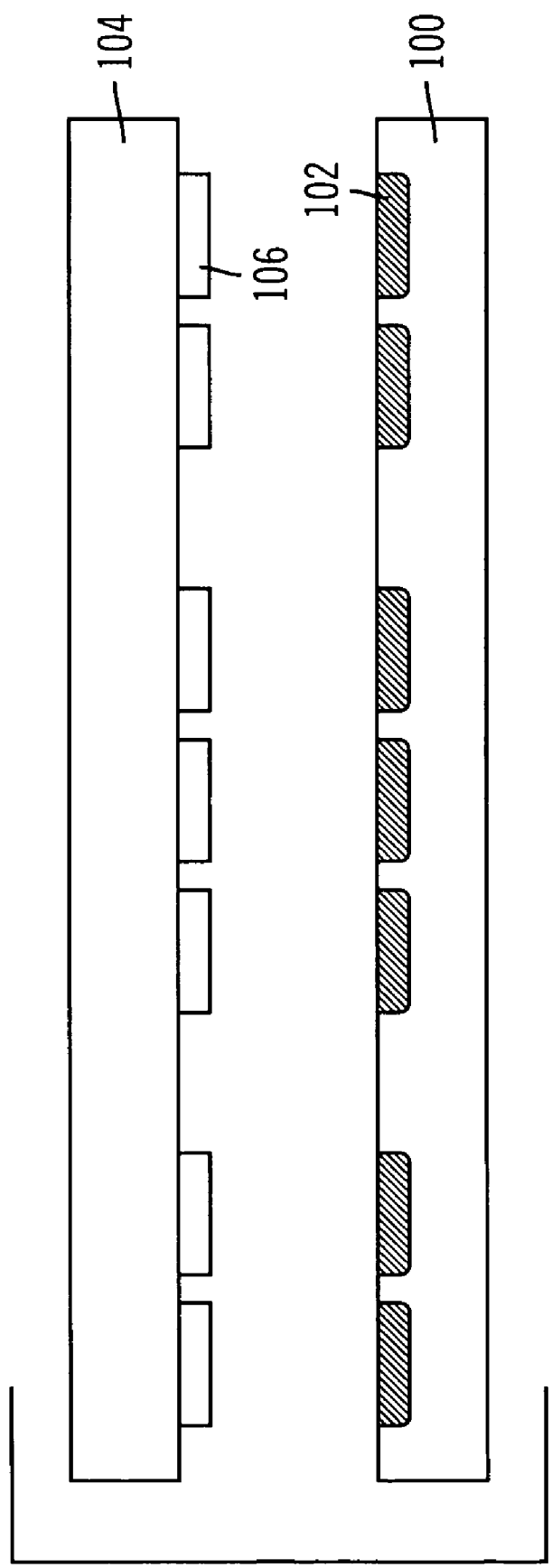
FIG. 1 is a side view of a prior art mold comprising an array of cavities corresponding to a particular pattern of pads on a substrate.

FIG. 1 shows a prior art rectangular mold 100 used in solder bumping techniques such as IMS and molten solder screening ("MSS"). Cavities 102 are formed in a pattern that corresponds to pads 106 on a substrate 102 that are to receive the solder. For example, FIG. 1 shows a side view of the prior art mold 100 and the corresponding substrate 104. The pattern of cavities 102 matches the pattern of pads 106 on the substrate 200. In other words, wherever a pad 106 exists on the substrate 104, a corresponding cavity 102 exists on the mold 100. Also, wherever a pad 106 is absent from the substrate 104, a cavity 102 is absent at the corresponding location on the mold 100. Therefore, as a new chip design is implemented or as an existing chip is redesigned, a new mold 100 needs to be created.

Universal Molds

Figure 3:
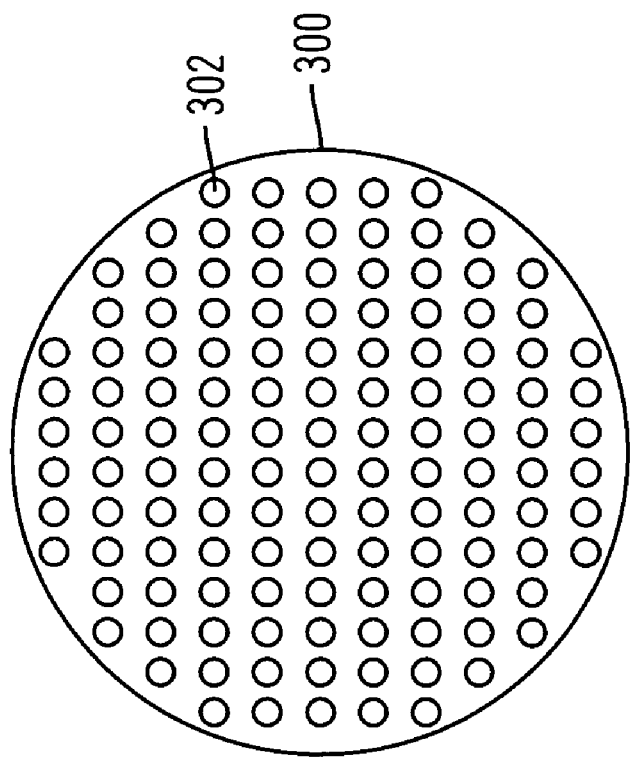
FIG. 3 is a top view of a universal non-rectangular mold comprising an array of cavities that populates the entire active area of the mold irrespective of a chip design, according to an embodiment of the present invention.
Figure 2:
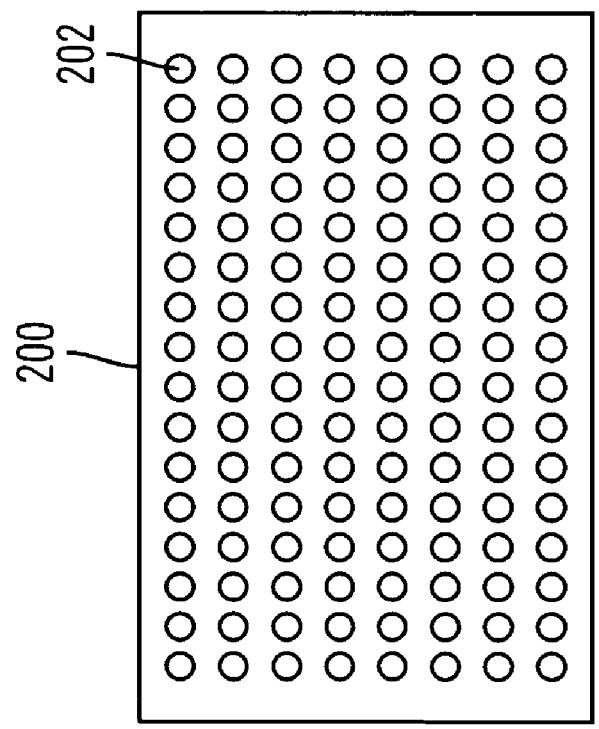
FIG. 2 is a top view of a universal rectangular mold comprising an array of cavities that populates the entire active area of the mold irrespective of a chip design, according to an embodiment of the present invention.
Figure 4:
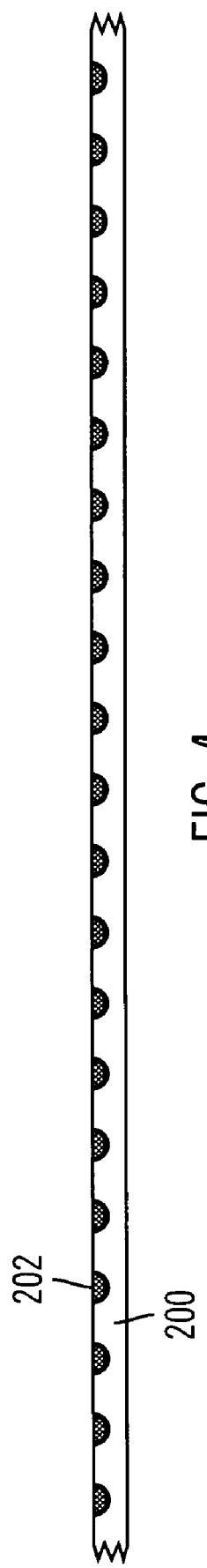
FIG. 4 is a side view of the universal rectangular mold of FIG. 2, according to an embodiment of the present invention.

According to an embodiment of the present invention, FIGS. 2 and 3 show examples of a universal rectangular mold 200 and a universal non-rectangular mold 300. FIG. 4 shows a side view of the universal rectangular mold 200. Each mold is comprised of borofloat glass, silicon wafers, kapton, polyimide on glass, carbon, molybdenum, or the like. The universal rectangular mold 200 is a more conventional mold shape and is useful for solder bumping techniques such as MSS and conventional IMS wherein a linear motion is used to apply solder to the cavities 202. The non-rectangular universal mold 300, in one embodiment, is circular, oval, hexagonal, polygonal, triangular, or the like and is useful in solder bumping techniques wherein a rotational fill technique is implemented. One such solder bumping technique that implements rotational fill techniques is the IMS system as described in the co-pending application Ser. No. 11/409,232 entitled "Rotational Fill Techniques For Injection Molding Of Solder", which is commonly owned herewith by International Business Machines Corporation and is incorporated herein by reference in its entirety. Although the foregoing discussion is directed towards using the universal mold 200, 300 with an integrated circuit, the universal mold 200, 300 can also be used with mechanical applications, optical applications, and the like.

Cavities 202, 302 are formed on the universal molds 200, 300 by using any formation technique as would be understood by those of ordinary skill in the art. In one embodiment the cavities 202, 302 are hemispherical, pyramidal, or the like. The volume of the cavities 202, 202, in one embodiment, is equal to the desired volume of solder. In one embodiment, the pitch of the cavities 202, 302 is constant across the mold 200, 202 thereby resulting in each of the solder bumps within the cavities 202, 302 having the same pitch. In one embodiment, the cavities 202, 302 are configured so that the solder bumps have the same pitch but can vary in diameter size. However, in another embodiment, the universal mold 200, 300 comprises cavities 202, 302 having at least a minimum pitch. In other words, the pitch between cavities can vary as long as the minimum pitch requirement is met. Although solder is used throughout this disclosure as the material to be provided into the cavities 202, 202, any conductive material such as conductive epoxy, solder pastes, adhesives impregnated with conductors (e.g. metal particles), or the like may be used.

The cavities 202, 302 having a constant pitch, in one embodiment, are formed on the universal mold 200, 300 across the full area of a receiving substrate (along two dimensions). Dimension, in one embodiment, is a line along an axis of the mold 200, 300. For example, if a receiving substrate is a 200 mm wafer, the universal mold 200, 300 is fully populated with cavities 202, 302 out to a 200 mm diameter. In one embodiment, the size, and pitch of the cavities 202, 302 match the ground rules of the respective technology being used, e.g. 4 mils or mili-inches pads on 8 mils or mili-inches centers, 3 mils or mili-inches pads on 6 mils or mili-inches centers, or the like. In the example of a 200 mm wafer with 4-on-8 technology, the universal mold 200, 300 is continuously populated with cavities of 4 mils or mili-inches diameter on 8 mils or mili-inches pitch configuration.

In other words, according to one embodiment, an array (or grid) of cavities 202, 302 is formed over an entire surface (two dimensions) of the universal mold 200, 300 corresponding to the size of the receiving substrate irrespective of the pad layout on the substrate. The cavities 202, 302, in one embodiment, are formed at a pitch along a line (dimension) on the universal mold 200, 300. The line can be parallel with respect to an edge of the universal mold 200, 300 or diagonal. The pitch, in one embodiment, is constant or alternatively increases at a constant rate. It should be noted that the present invention is not limited to placing the cavities along a straight line.

The cavities 202, 302 are formed on the universal mold 202, 302 even at locations corresponding to the substrate where the substrate does not include pads. The term "universal mold" is herein defined as a mold which can be used with any substrate of a given technology design such as 4 mils or mili-inches on 8 mils or mili-inches centers. For example, a universal mold for the 4 mils or mili-inches on 8 mils or mili-inches center technology can be used with any 4 on 8 chip irrespective of the chip's pad arrangement. In one approach, at least one wettable surface of a plurality of wettable surfaces along at least one line on an axis of a substrate is placed in substantial contact with heated conductive bonding material in at least one cavity of the plurality of cavities. This causes the conductive bonding material in the at least one cavity to adhere to the at least one wettable surface. A pitch of the plurality of wettable surfaces along the at least one line on the axis of the substrate is substantially equal to the pitch of the plurality of cavities along the at least one line on the axis of the mold. A wettable surface, in one embodiment, is a conductive pad. It should be noted that the present invention is not limited to placing wettable surfaces along a straight axis of a substrate.

Figure 5:
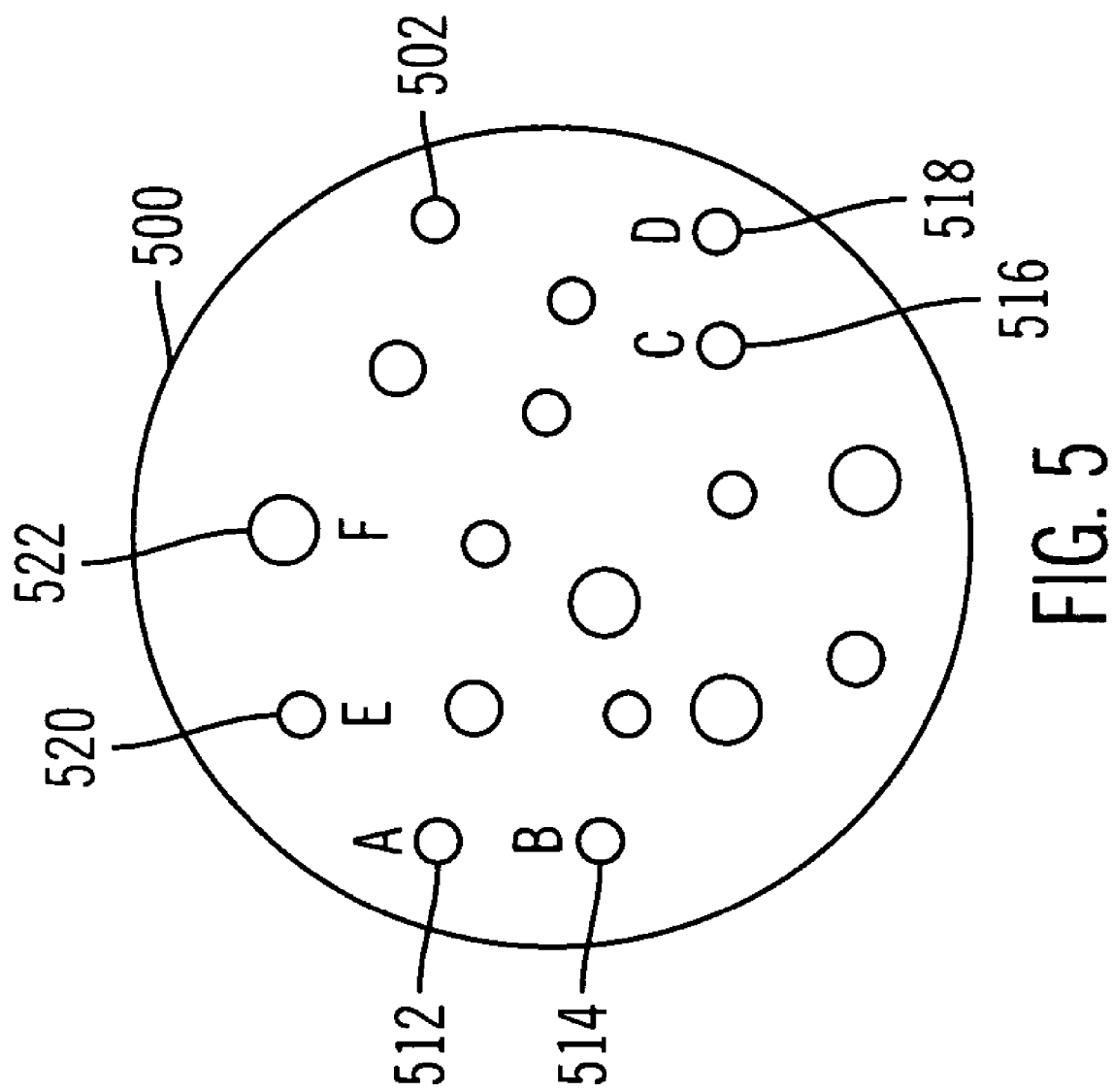
FIG. 5 is a top view of a universal mold having cavities arranged at a pitch corresponding to at least a minimum pitch value, according to an embodiment of the present invention.

FIG. 5 shows an embodiment where a universal mold 500 includes cavities 502 having a pitch that is not constant and conforms to at least a minimum pitch. Pitch, in one embodiment, is measured from the center points of the cavities 502. However, in other embodiments, pitch can be measured from any designated point on or about a cavity 502. The cavities 502 are not necessarily formed along an axis of the universal mold 200, 300. For example, the arrangement of the cavities 502 does not necessarily represent a pattern or a straight line.

The pitch between cavities 502 can vary as long as a minimum pitch value is met. For example, the pitch between cavity A 512 and cavity B 514 and the pitch between cavity C 516 and cavity D 518 are at the minimum allowable pitch. However, the pitch between cavity E 520 and cavity F 522 varies from other pitches between cavities, but is greater than the minimum allowable pitch. A substrate (not shown) can include one or more wettable surfaces that correspond to all of the cavities or a subset of the cavities on the universal mold 500. In other words, a substrate (not shown) can include wettable surfaces corresponding to any combination of the cavities on the universal mold 500.

One advantage of the present invention is that the universal molds 200, 300 can be used interchangeably across different chips of the same design ground rules, e.g. solder pitch pad, regardless of pad density, die size, or form factor. Another advantage of the present invention is that one universal mold 200, 300 exists for any required pad pitch, e.g. 3 mils or mili-inches pads on 6 mils or mili-inches centers, 4 mils or mili-inches pads on 8 mils or mili-inches centers, and the like, additional molds do not need to be made. In other words, the universal molds 200, 300 can be used with substrates comprising various pad layouts.

Figure 6:
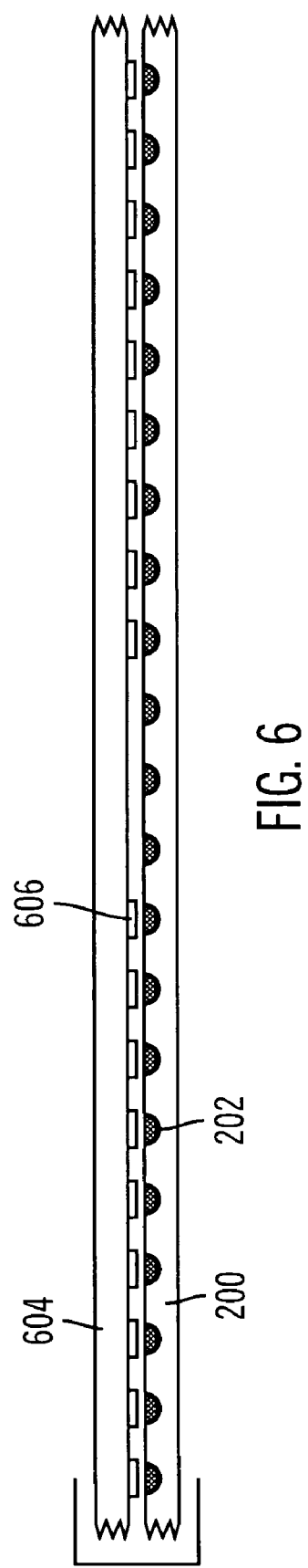
FIG. 6 is a side view of the universal rectangular mold of FIG. 2 and a substrate with a particular pattern of pads being aligned with respect to each other, according to an embodiment of the present invention.
Figure 7:
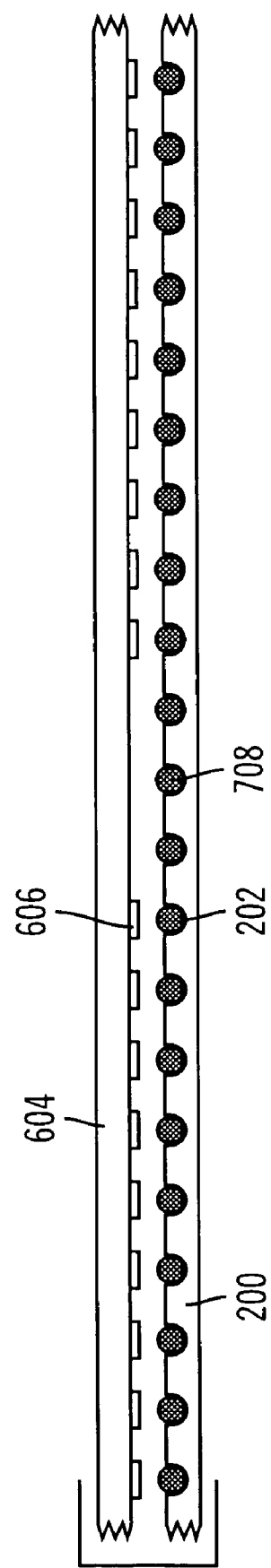
FIG. 7 is a side view of the universal rectangular mold of FIG. 2 and the substrate of FIG. 6 after the mold has been heated to a reflow temperature, according to an embodiment of the present invention.

FIGS. 6-10 show side views of the universal mold 200 and a receiving substrate 604. The cavities 202 are formed across the entire receiving area of the substrate 604. Solder is provided to the cavities by, for example, IMS. Once molten or liquefied solder or other bonding material is provided to the cavities 202, the solder is solidified within the cavities 202. The solidification occurs when the solder within the cavities 202 contact a cooling gas as the cavities 202 pass under a solder fill head (not shown). An exemplary cooling process is described in the co-pending application Ser. No. 11/409,232, entitled "Rotational Fill Techniques For Injection Molding Of Solder". The substrate 604 is aligned with the universal mold 200 so that the wetting pads 606 on the substrate are above their corresponding one of the cavities 202, as shown in FIG. 6. The universal mold 200 and/or the substrate 604 is brought to an elevated temperature by heating the universal mold 200 and/or the substrate 604. The heating causes the solder within the cavities 202 to rise due to surface tension, creating solder balls 708, as shown in FIG. 7.

Figure 8:
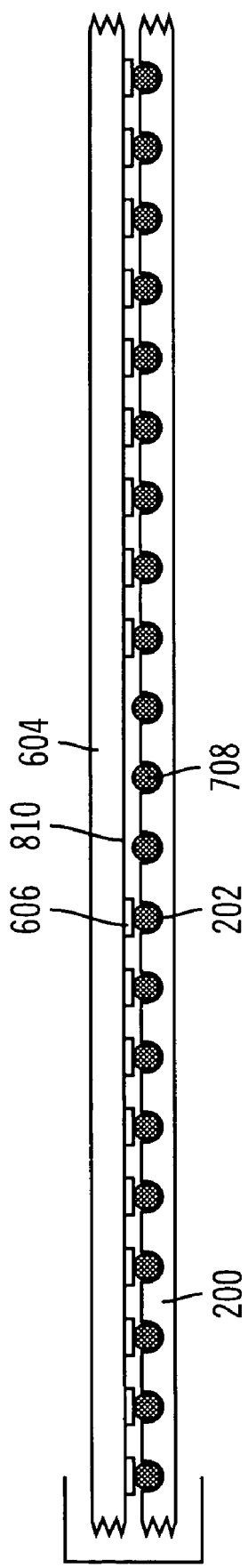
FIG. 8 is a side view of the universal rectangular mold of FIG. 2 and the substrate of FIG. 6 wherein the substrate is contacting the solder in the cavities, according to an embodiment of the present invention.
Figure 9:
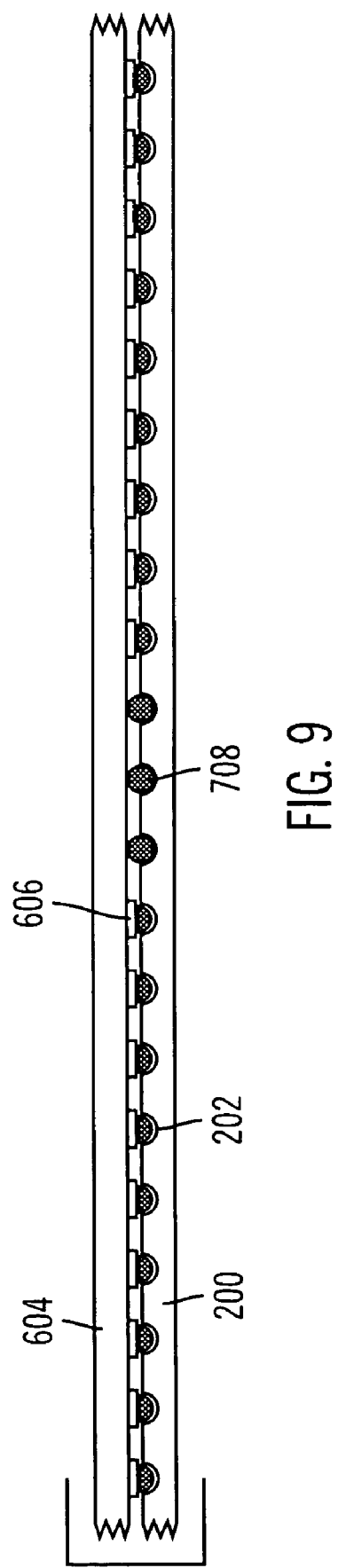
FIG. 9 is a side view of the universal rectangular mold of FIG. 2 wherein the solder has adhered to the pads of the substrate, according to an embodiment of the present invention.

The substrate 604 and the universal mold 200 are brought into closer proximity to each other allowing the solder balls 708 to come into contact with the pads 606 on the substrate 604, as shown in FIG. 8. The solder balls automatically wet and wick onto the pads 606 of the substrate 604, as shown in FIG. 9. The wicking effect can be easily accomplished where the pitch of the pads 606 is constant. In one embodiment, the design pitch of the substrate 604 is maintained across kerf and dicing channels. This is accomplished, in one embodiment, by providing design rules that set the stepping of chips on an even multiple of the design pitch, e.g., step and repeat dimensions and an even multiple of the pad pitch.

Figure 10:
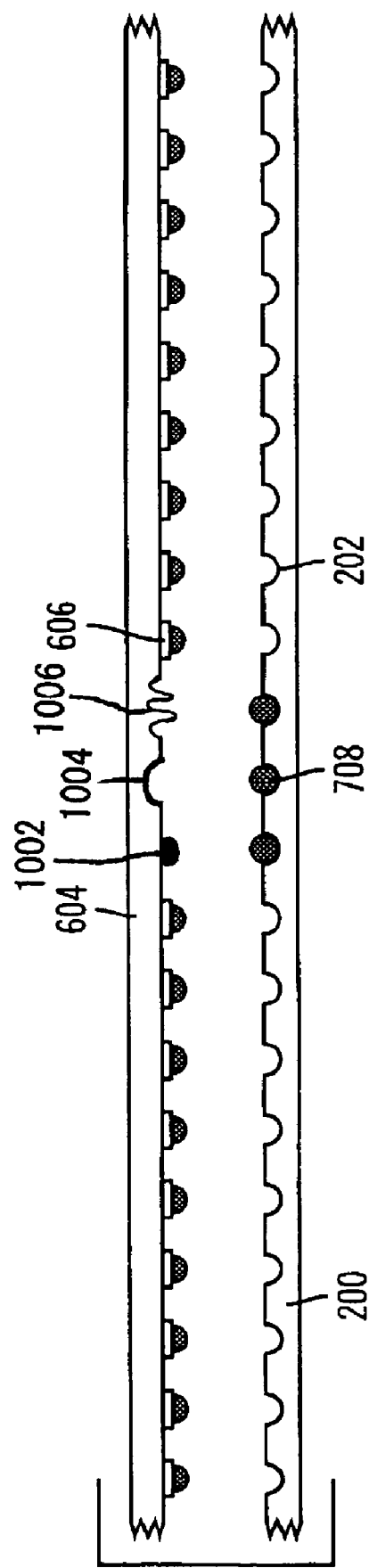
FIG. 10 is a side view of the universal rectangular mold of FIG. 2 and the substrate after the substrate has been lifted from the mold, according to an embodiment of the present invention.

The substrate 604 and the universal mold 200 are then separated causing the solder 608 in contact with a pad 606 to be lifted out of the cavities 202, as shown in FIG. 10. The solder balls 708 in the cavities 202 without a corresponding wettable pad remain in the universal mold 200. The remaining solder can then be removed or recycled and the universal mold 200 cleaned for reuse. The removing/recycling of the solder and the cleaning of the universal mold 200 can be done by methods which would be well understood by those of ordinary skill in the art.

In one embodiment, areas on the substrate that do not have a pad 606 also contact the solder balls 708 in the cavities. As stated above, the mold 200 includes cavities 202, for example, in a grid configuration wherein solder is provided to every cavity in the grid. Because the solder balls 708 rise above the cavities 202 when heated and the substrate 604 is in close proximity to the mold 200, the solder balls 708 contact the pads 606 and a non-conductive surface 810 of the substrate 604. Once the substrate 604 is separated from the mold 200, an artifact or indication of contact with a conductive bonding material exists at the location where the solder ball 708 contacted the non-conductive surface 810 of the substrate 604. The artifact/indication, in one embodiment, is conductive bonding material residue 1002, an indentation 1004, warping 1006 of the non-conductive surface 810, or the like.

Although the embodiments above are with respect to solder bumps, the present invention is also applicable for creating solder columns. For example, the universal molds 200, 300, in one embodiment, can also be configured for solder column formation. Furthermore, more than one type of solder composition can be applied to a single pad 606. For example, a solder with a low melting point can be adjoined to the desired contacting surface, pad, or solder of an opposing microelectronic component. A solder with a high melting point maintains its shape such as, but not limited so, a solder column. Additionally, solder bumps and/or solder column with the same universal pitch can be used to comment multiple heights on the adjoining microelectronic component or package.

Figure 11:
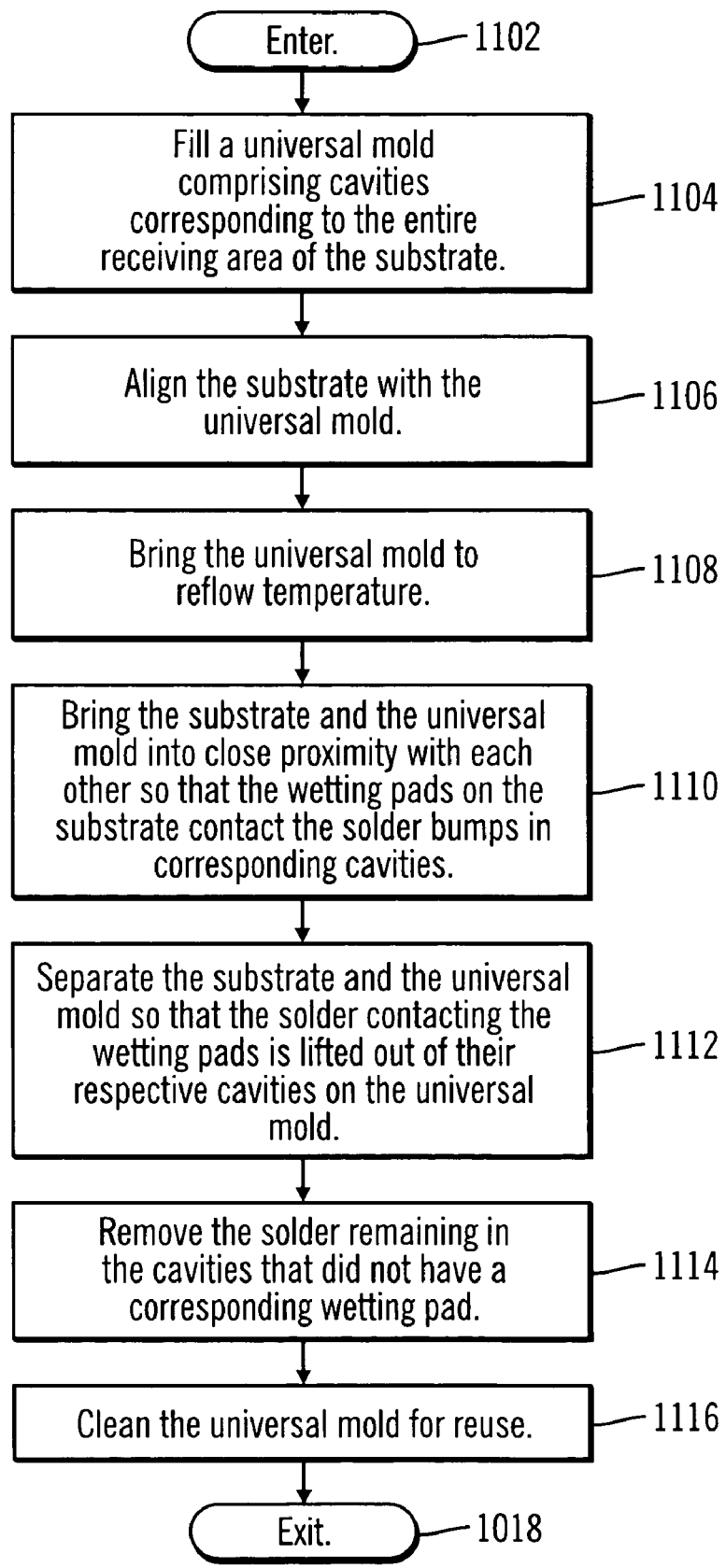
FIG. 11 is an operational flow diagram illustrating an exemplary embodiment of injection molding of solder using the universal mold of FIG. 2, according to an embodiment of the present invention.

FIG. 11 is an operational flow diagram illustrating an exemplary embodiment of applying solder bumps by injection molding of solder to substrates using a universal mold. The operational flow diagram of FIG. 11 begins at step 1102 and flows directly to step 1104. The cavities 202, 302 of a universal mold 200, 300, at step 1104, are filled with solder using, for example, IMS. A substrate 604, at step 1106, is aligned with the universal mold 200, 300 using any technique that would be understood to those of ordinary skill in the art. Once the substrate 604 and the universal mold 200, 300 are aligned, the universal mold 200, 300, at step 1108, is heated to a reflow temperature. This causes the solder in the cavities to rise above the cavity 202, 302. The mold 200, 300 includes cavities 202, 302 arranged in a grid irrespective of the pad arrangement of the substrate 604. Therefore, cavities 202, 302 exist in locations where pads 606 do not exist on the substrate 604.

The substrate 604, at step 1111, is brought into close proximity of the universal mold 200, 300. The wetting pads 606 of the substrate 204 contact the solder balls 708 in the corresponding cavities. The solder balls 708 wick up to the wetting pads 606. The substrate 504, at step 1112, is separated from the universal mold 200, 300 thereby lifting the solder balls 708, which have attached to the wetting pads 606, out of their respective cavities 202, 302. The remaining solder in cavities 202, 302 that did not have a corresponding wetting pad 606, at step 1114, is removed for disposal or recycling. The universal mold 200, 300, at step 1116, is cleaned by using any technique that would be understood by those of ordinary skill in the art. Once the universal mold 200, 300 is cleaned, it can be then be reused. The control flow then exits at step 1118.

Another advantage of the present invention is that pitch is already maintained across given chips, which are defined lithographically by the design sizes on existing photomasks. The present invention can be implemented with existing wafer builds and existing mask sets by performing a simple stepping dimension change so that the same even pitch of pads across kerf channels or dicing channels is achieved.

NON-LIMITING EXAMPLES

The foregoing embodiments of the present invention are advantageous because universal molds can be used interchangeably across different chips of the same design ground rules, e.g. solder pitch pad, regardless of pad density, die size, or form factor. Another advantage of the present invention is that once a universal mold 200, 300 exists for any required pad pitch, e.g. 3 mils or mili-inches pads on 6 mils or mili-inches centers, 4 mils or mili-inches pads on 8 mils or mili-inches centers, and the like, additional molds do not need to be made. In other words, the universal molds 200, 300 can be used with substrates comprising various pad layouts.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A method of applying conductive bonding material to circuit-supporting substrates of integrated circuit chips, each such integrated circuit chip comprising:
    a circuit-supporting substrate;
    at least one electronic circuit disposed on the circuit-supporting substrate;
    a plurality of conductive pads disposed on the circuit-supporting substrate, each conductive pad of the plurality of conductive pads arranged at a pitch $P_{SUBSTRATE}$ having a value, wherein the value of the pitch $P_{SUBSTRATE}$ is equal to or greater than a value of a pitch $P_{MOLD}$ between cavities on a mold used for applying conductive bonding material to each conductive pad; and
    at least one non-conductive and non-pad position being a surface of the circuit-supporting substrate at the pitch $P_{SUBSTRATE}$; and
    wherein the method comprising the steps of:
        providing conductive bonding material in a plurality of cavities of the mold used for applying conductive bonding material to each conductive pad of the plurality of conductive pads disposed on the circuit-supporting substrate;
        heating the conductive bonding material in the plurality of cavities of the mold to a reflow temperature of the conductive bonding material;
        bringing the mold and the corresponding circuit-supporting substrate in close proximity to each other such that the heated conductive bonding material in at least one cavity of the plurality of cavities comes in contact with at least one conductive pad of the plurality of conductive pads and the heated conductive bonding material in at least a second cavity of the plurality of cavities comes in contact with the at least one non-conductive and non-pad position on the surface of the circuit-supporting substrate; and
        separating the mold from the circuit-supporting substrate, wherein, subsequent to the separating, the at least one non-conductive and non-pad position on the surface of the circuit-supporting substrate includes an indication of contact with conductive bonding material residing in at least one cavity in the plurality of cavities, wherein the indication of contact with the conductive bonding materials includes at least one of:
    an indentation in the surface of the circuit-supporting substrate; and
    conductive bonding material residue at the surface of the circuit-supporting substrate.

2. The method of claim 1, wherein the mold is one of non-rectangular and rectangular.

3. The method of claim 1, wherein the conductive bonding material comprises solder.

4. The method of claim 1, wherein the plurality of conductive pads and the at least one non-conductive-pad position of the circuit-supporting substrate are arranged at a pitch $P_{SUBSTRATE}$ on the circuit-supporting substrate that is twice the value of the pitch $P_{MOLD}$ between cavities on the mold.

5. The method of claim 1, wherein the plurality of conductive pads and the at least one non-conductive-pad position are arranged at a pitch $P_{SUBSTRATE}$ on the circuit-supporting substrate that is a positive integer multiple greater than 1 of the pitch $P_{MOLD}$ between cavities on the mold.

* * * * *